(12) United States Patent
Okazaki et al.

(10) Patent No.: US 12,625,190 B2
(45) Date of Patent: May 12, 2026

(54) VOLTAGE DETECTION UNIT AND POWER STORAGE DEVICE

(71) Applicants: YAZAKI CORPORATION, Tokyo (JP); TOYOTA JIDOSHA KABUSHIKI KAISHA, Aichi-ken (JP)

(72) Inventors: Yutaro Okazaki, Shizuoka (JP); Shinichi Yanagihara, Shizuoka (JP); Satoshi Morioka, Aichi-ken (JP); Hiroyuki Kaiya, Aichi-ken (JP); Hiromi Ueda, Aichi-ken (JP); Shinpei Mune, Aichi-ken (JP); Naoto Morisaku, Aichi-ken (JP); Yutaro Kawabata, Aichi-ken (JP); Daiki Tanaka, Shizuoka (JP); Seigo Mochizuki, Shizuoka (JP)

(73) Assignees: YAZAKI CORPORATION, Tokyo (JP); TOYOTA JIDOSHA KABUSHIKI KAISHA, Toyota (JP)

( * ) Notice: Subject to any disclaimer, the term of this patent is extended or adjusted under 35 U.S.C. 154(b) by 147 days.

(21) Appl. No.: 18/735,800

(22) Filed: Jun. 6, 2024

(65) Prior Publication Data

US 2025/0004057 A1 Jan. 2, 2025

(30) Foreign Application Priority Data

Jun. 28, 2023 (JP) ................................ 2023-106245

(51) Int. Cl.
*G01R 31/38* (2006.01)
*G01K 7/22* (2006.01)
*G01R 31/3835* (2019.01)

(52) U.S. Cl.
CPC ........... *G01R 31/3835* (2019.01); *G01K 7/22* (2013.01)

(58) Field of Classification Search
CPC .. G01R 31/3835; G01R 31/364; G01R 19/00; G01R 31/385; G01K 7/22; Y02E 60/10;
(Continued)

(56) References Cited

U.S. PATENT DOCUMENTS 10,330,536 B2 * 6/2019 Okamoto ................. G01K 1/14
11,313,915 B2 * 4/2022 Kondo ............... G01R 31/3842
(Continued)

FOREIGN PATENT DOCUMENTS

JP 2020-161340 A 10/2020

*Primary Examiner* — Giovanni Astacio-Oquendo
(74) *Attorney, Agent, or Firm* — Sughrue Mion, PLLC

(57) ABSTRACT

A voltage detection unit includes: a voltage detection terminal having a first location configured to be conductively connected to a detection target; a plate-shaped housing having a terminal accommodating recess accommodating the voltage detection terminal; a cover configured to be locked to the housing at a temporary locking position where the first location of the voltage detection terminal accommodated in the terminal accommodating recess is not covered and a final locking position where the first location is covered; a temperature measurer accommodating a temperature-measuring element and attached to the housing; and an electric wire conductively connected to a second location of the voltage detection terminal and drawn out to the outside of the housing. The temperature measurer is arranged such that at least a part of the temperature measurer is overlapped with the voltage detection terminal in a plate thickness direction of the housing.

5 Claims, 10 Drawing Sheets

(58) Field of Classification Search
CPC ... H01M 10/48; H01M 10/486; H01M 50/569
USPC ......................................... 324/426, 425, 441
See application file for complete search history.

(56)                    References Cited

U.S. PATENT DOCUMENTS

2006/0108972  A1*   5/2006   Araya  ............... H01M 10/4207
                                                                          320/106
2022/0349923  A1*  11/2022   Morioka  ................... G01R 1/04
2023/0039506  A1*   2/2023   Lee  .................... H01M 10/425
2024/0159837  A1*   5/2024   Chae  .................... G01R 31/364
2024/0402256  A1*  12/2024   Hasegawa  .......... G01R 31/3835

\* cited by examiner

REAR

LEFT ← → RIGHT

FRONT

VOLTAGE DETECTION UNIT AND POWER STORAGE DEVICE

CROSS-REFERENCE TO RELATED APPLICATION(S)

This application is based upon and claims the benefit of priority from prior Japanese patent application No. 2023-106245 filed on Jun. 28, 2023, the entire contents of which are incorporated herein by reference.

BACKGROUND

1. Field of the Invention

The present disclosure relates to a voltage detection unit configured such that a voltage detection terminal to be conductively connected to a detection target is accommodated in a board-shaped housing, and a power storage device using the voltage detection unit.

2. Description of the Related Art

The related art has proposed a stacked power storage device in which a plurality of chargeable and dischargeable thin power storage modules are connected in series via conductive boards by alternately arranging and repeatedly stacking the board-shaped power storage modules and the conductive boards. The power storage modules used in this type of power storage device generally have a structure in which a plurality of battery cells are incorporated, and function as one battery capable of charging and discharging. In one of the power storage devices of the related arts, in order to monitor the output state of each power storage module (that is, the potential of the output face of each power storage module relative to the zero potential as a reference; hereinafter, simply referred to as "voltage of the power storage module"), a detection terminal such as a bus bar is connected to the conductive board in contact with the output face of the power storage module, and the voltage of the power storage module is measured through the detection terminal (for example, see JP2020-161340A).

However, when actually connecting the bus bar or the like to the conductive board in the power storage device having the above-described structure, since the power storage modules and the conductive boards have a thin plate shape, it is difficult to secure a space for installing the other components for connection (for example, bolts for bolt fastening or the like). Therefore, the power storage device of the related art described above is provided with an insertion hole for inserting the detection terminal in the side edge of each conductive board. The detection terminal is inserted into the insertion hole of the conductive board from the lateral side of the stacked body in which the power storage modules and the conductive boards are stacked, thereby connecting the conductive board and the detection terminal. However, according to this connection method of the related art, the positioning between the insertion hole of the conductive board and the detection terminal is complicated when inserting the detection terminal, which makes it difficult to improve the workability of connection work.

SUMMARY

An object of the present disclosure is to provide a voltage detection unit excellent in workability in a conductive connection with a detection target, and a power storage device using the voltage detection unit.

In order to achieve the object described above, a voltage detection unit and a power storage device according to the present disclosure are characterized as follows.

According to an aspect of the present disclosure, there is provided a voltage detection unit including: a voltage detection terminal having a first location configured to be conductively connected to a detection target; a plate-shaped housing having a terminal accommodating recess accommodating the voltage detection terminal; a cover configured to be locked to the housing at a temporary locking position where the first location of the voltage detection terminal accommodated in the terminal accommodating recess is not covered and a final locking position where the first location is covered; a temperature measurer accommodating a temperature-measuring element and attached to the housing; and an electric wire conductively connected to a second location of the voltage detection terminal and drawn out to the outside of the housing, in which the temperature measurer is arranged such that at least a part of the temperature measurer is overlapped with the voltage detection terminal in a plate thickness direction of the housing to restrict the voltage detection terminal accommodated in the terminal accommodating recess from moving in the plate thickness direction.

According to another aspect of the present disclosure, there is provided a power storage device including: a board-shaped conductive module including the voltage detection unit and a conductive board as the detection target to which the voltage detection terminal is conductively connected; and a power storage module configured to be charged and discharged, on which the conductive module is stacked.

According to the voltage detection unit and the power storage device according to the present disclosure, the cover can be locked to the housing while accommodating the voltage detection terminal whose second location is connected to the electric wire in the terminal accommodating recess of the housing and exposing the first location of the voltage detection terminal. Therefore, when the voltage detection unit is electrically connected to a detection target (for example, a conductive board or the like used in a stacked power storage device), for example, after the voltage detection unit is assembled to the detection target, the exposed first location of the voltage detection terminal can be fixed to the detection target using a method such as ultrasonic joining or welding. This does not require another component for connection as compared to typical bolt fastening or the like, and can easily align the two components and reduce the contact resistance at the contact point as compared to the connection methods of the related art described above. By disposing the cover at a final locking position after the detection target and the voltage detection terminal are connected, the first location of the voltage detection terminal (that is, the contact point therebetween) can be covered and protected by the cover.

Further, by attaching a temperature measurer (for example, a thermistor) to the housing before attaching the cover to the housing as described above, at least a part of the temperature measurer is overlapped with the voltage detection terminal in the plate thickness direction, which prevents the voltage detection terminal accommodated in the terminal accommodating recess from moving in the plate thickness direction (so-called ride-on of the voltage detection terminal). The at least a part of the temperature measurer may be in contact with the voltage detection terminal, or may be separated from the voltage detection terminal with a gap that can be allowed from the viewpoint of restricting the movement of the voltage detection terminal. As a result, for example, the voltage detection terminal accommodated in the terminal accommodating recess is avoided from unintentionally moving in the plate thickness direction and hindering the attachment of the cover to the housing. Further, if the voltage detection terminal moves in the plate thickness direction from the original accommodation position before the temperature measurer is attached (for example, if the voltage detection terminal is not appropriately accommodated in the terminal accommodating recess and rides on the peripheral edge of the terminal accommodating recess), the attachment of the temperature measurer to the housing is hindered by the voltage detection terminal, so that it can be detected that the voltage detection terminal is not appropriately accommodated in the terminal accommodating recess.

Therefore, the voltage detection unit and the power storage device according to the present disclosure are excellent in workability for conductively connecting to the detection target. Further, the voltage detection unit and the power storage device of the present configuration can easily and appropriately assemble the voltage detection terminal and the cover to the housing.

The present disclosure has been briefly described above. Further, details of the present disclosure can be clarified by reading modes (hereinafter, referred to as an "embodiment") for carrying out the disclosure to be described below with reference to the accompanying drawings.

BRIEF DESCRIPTION OF THE DRAWINGS

The present disclosure will become more fully understood from the detailed description given hereinbelow and the accompanying drawing which is given by way of illustration only, and thus is not limitative of the present disclosure and wherein.

DETAILED DESCRIPTION OF THE INVENTION

Embodiment

Figure 1:
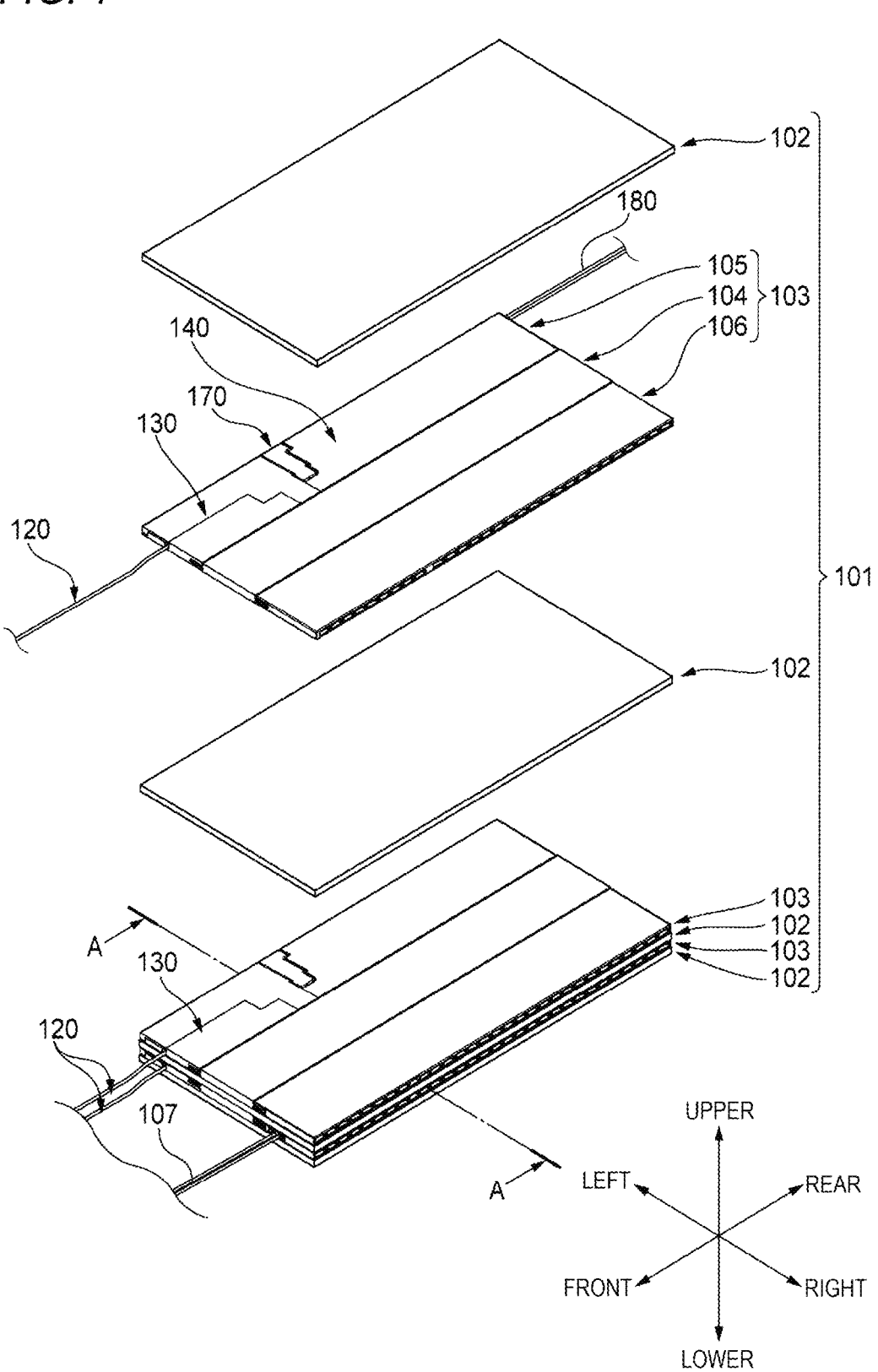
FIG. 1 is a partially exploded perspective view illustrating a stacked power storage device including a voltage detection unit according to the present embodiment.

Hereinafter, a voltage detection unit 105 and a power storage device 101 according to the present embodiment will be described with reference to the drawings. Hereinafter, for convenience of description, "front", "rear", "upper", "lower", "left", "right", a "front-rear direction", a "left-right direction", and an "upper-lower direction" are defined as illustrated in FIG. 1. The "front-rear direction", the "left-right direction", and the "upper-lower direction" are orthogonal to one another.

The voltage detection unit 105 is typically used in a stacked power storage device 101 illustrated in FIG. 1. The power storage device 101 is formed by alternately stacking, in the upper-lower direction, rectangular thin board-shaped power storage modules 102 capable of charging and discharging and rectangular thin board-shaped conductive modules 103 capable of electrically connecting adjacent power storage modules 102. In the power storage device 101, a plurality of power storage modules 102 are electrically connected in series via the conductive modules 103. Each power storage module 102 has a structure in which a plurality of battery cells (not illustrated) are incorporated, and the power storage modules 102 as a whole function as one battery capable of charging and discharging.

Figure 2:
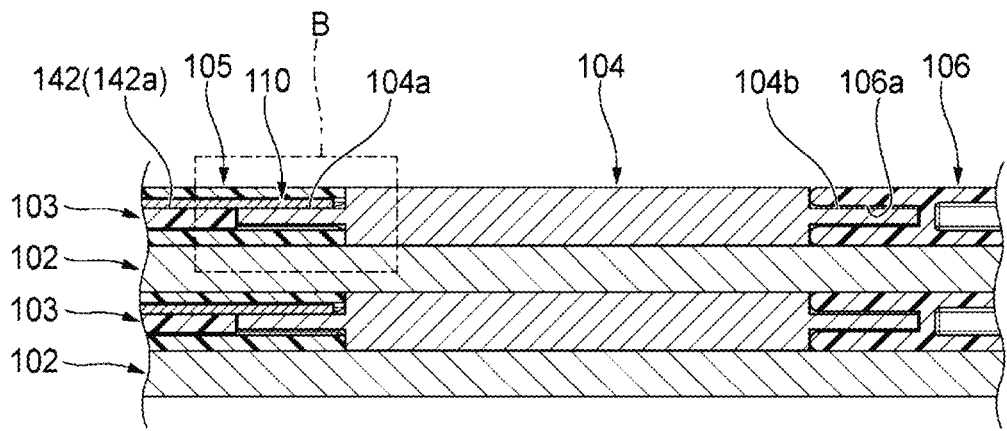
FIG. 2 is a cross-sectional view taken along a line A-A of FIG. 1.
Figure 2:
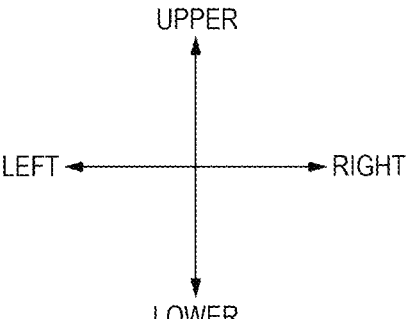
Figure 3:
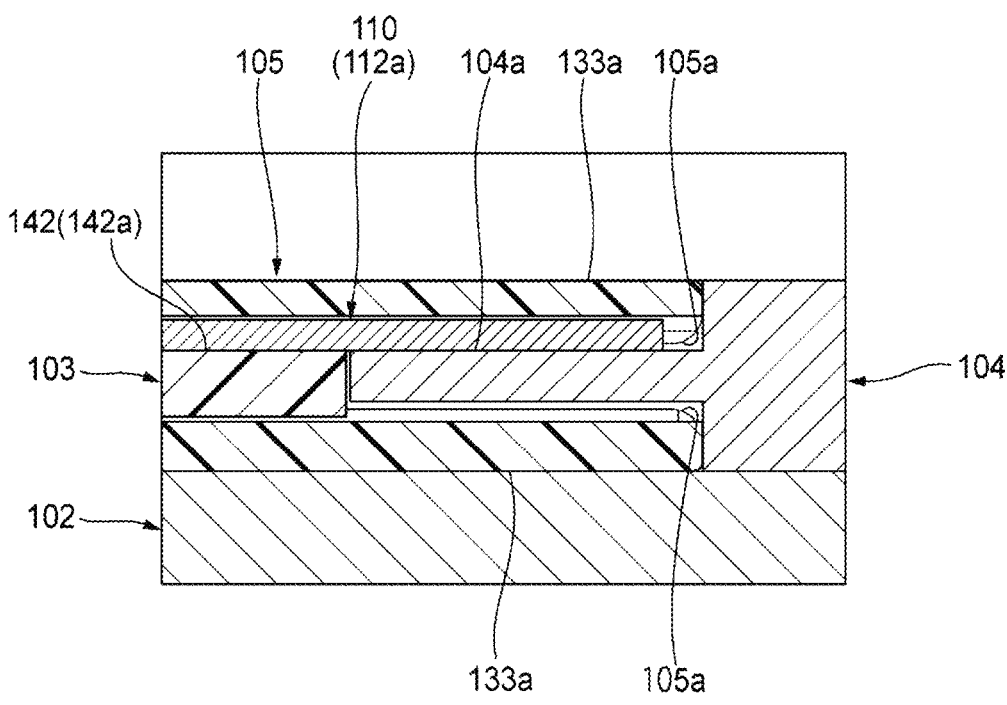
FIG. 3 is an enlarged view of a portion B in FIG. 2.
Figure 3:
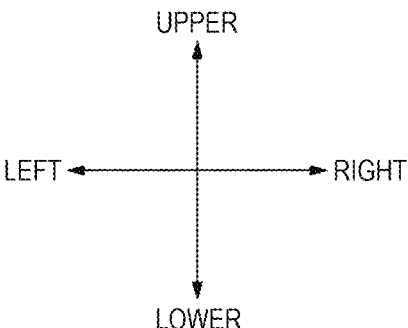

As illustrated in FIG. 1, each conductive module 103 is formed to have a rectangular thin board shape as a whole by a rectangular thin board-shaped conductive board 104 (the conductive board 104 also functions as a heat sink as described later), the rectangular thin board-shaped voltage detection unit 105 coupled to the left side of the conductive board 104, and a rectangular thin board-shaped facing unit 106 coupled to the right side of the conductive board 104. As illustrated in FIGS. 1 to 3 (in particular, see FIG. 2), the conductive board 104 and the voltage detection unit 105 are coupled to each other by fitting a flange 104a into a recess 105a. The flange 104a is provided on the left end face of the conductive board 104 and extends in the front-rear direction. The recess 105a is provided on the right end face of the voltage detection unit 105 and extends in the front-rear direction. The conductive board 104 and the facing unit 106 are coupled to each other by fitting a flange 104b into a recess 106a. The flange 104b is provided on the right end face of the conductive board 104 and extends in the front-rear direction. The recess 106a is provided on the left end face of the facing unit 106 and extends in the front-rear direction.

In each of the conductive modules 103 positioned between the power storage modules 102 adjacent to each other in the upper-lower direction, the conductive board 104 is in direct contact with the upper and lower power storage modules 102 as illustrated in FIG. 2. Thus, the conductive board 104 functions to perform conduction between the lower face of the upper power storage module 102 and the upper face of the lower power storage module 102, and functions as a heat sink that releases heat generated from the upper and lower power storage modules 102 to the outside.

In each of the conductive modules 103 located between the power storage modules 102 adjacent to each other in the upper-lower direction, the voltage detection unit 105 includes a voltage detection terminal 110 (see FIG. 2 and the like) in contact with the conductive board 104, which is to be described later. The voltage detection unit 105 has a function of outputting a signal indicating a voltage between the upper and lower power storage modules 102 (specifically, the potential of the upper face (output face) of the lower power storage module 102 relative to the zero potential as a reference) via an electric wire 120 (see FIG. 1, etc.) connected to the voltage detection terminal 110. The voltage detection unit 105 is disposed to the left of the conductive board 104 in FIGS. 1 to 3, but a voltage detection unit having the same function as the voltage detection unit 105 may be disposed to the right of the conductive board 104. In this case, a voltage detection unit obtained by reversing the entire configuration of the voltage detection unit 105 in the left-right direction (that is, a mirror component of the voltage detection unit 105) is used as the voltage detection unit having the same function as that of the voltage detection unit 105.

Any one of a voltage detection unit, a dummy unit, and a temperature detection unit, which will be described later, is applied as the facing unit 106 to each of the conductive modules 103 positioned between the power storage modules 102 adjacent to each other in the upper-lower direction, according to the specification of the power storage device 101.

If the facing unit 106 is a voltage detection unit, a voltage detection unit obtained by reversing the entire configuration of the voltage detection unit 105 in the left-right direction (that is, a mirror component of the voltage detection unit 105 described above) is used as the facing unit 106. In this case, the voltage detection unit 105 is disposed to the left of the conductive board 104, and the mirror component of the voltage detection unit 105 is disposed to the right of the conductive board 104. The facing unit 106 (a mirror component of the voltage detection unit 105) has the same function as that of the voltage detection unit 105.

If the facing unit 106 is a dummy unit, a simple resin board having a recess 106a (see FIG. 2) extending in the front-rear direction is used as the facing unit 106. In this case, the facing unit 106 performs only the function of filling the gap between the upper and lower power storage modules 102.

If the facing unit 106 is a temperature detection unit, the facing unit 106 has a structure in which a temperature sensor (not illustrated) is incorporated in a resin board used as a dummy unit. In this case, the facing unit 106 has a function of outputting a signal indicating the temperature of the upper and lower power storage modules 102 via an electric wire 107 (see FIG. 1) connected to the temperature sensor.

Figure 4:
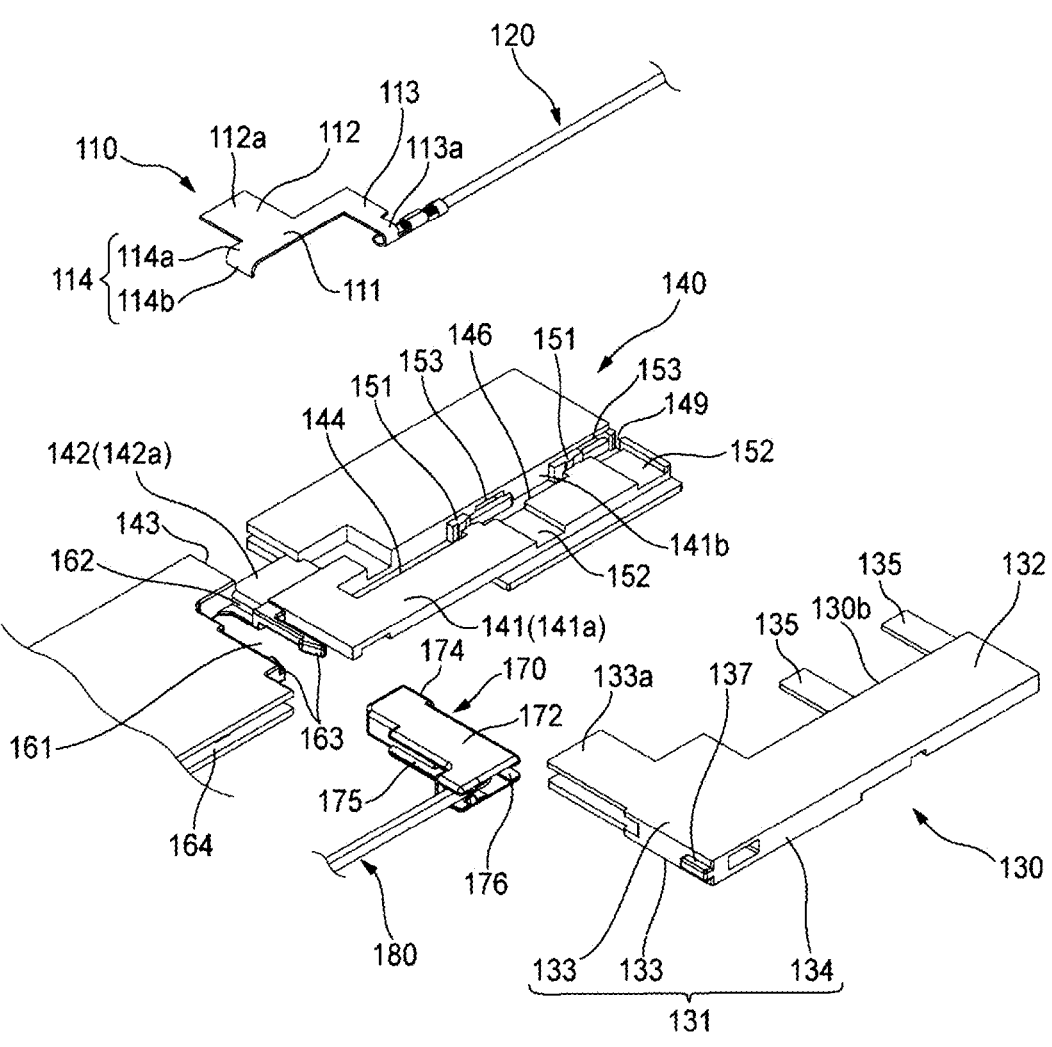
FIG. 4 is an exploded perspective view of the voltage detection unit illustrated in FIG. 1.
Figure 4:
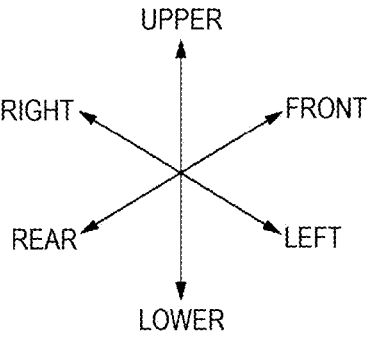

Hereinafter, a specific configuration of the voltage detection unit 105 according to the present embodiment will be described with reference to FIGS. 4 to 10. As illustrated in FIG. 4, the voltage detection unit 105 includes a housing 140, a voltage detection terminal 110 accommodated in the housing 140, an electric wire 120 connected to the voltage detection terminal 110 and accommodated in the housing 140, a cover 130 mounted to the housing 140, and a thermistor 170 mounted to the housing 140. The thermistor 170 corresponds to a "temperature measurer" in the present disclosure.

The voltage detection terminal 110 is accommodated in a terminal accommodating recess 142 (see FIG. 4) formed in the housing 140, which is to be described later. The electric wire 120 is accommodated in an electric wire accommodating recess 146 (see FIG. 4) formed in the housing 140, which is to be described later. The cover 130 is mounted in cover mounting recesses 141 (see FIG. 4) formed in the housing 140, which are to be described later. The thermistor 170 is mounted to a thermistor mounting recess 161 (see FIG. 4) formed in the housing 140, which is to be described later. Hereinafter, the members constituting the voltage detection unit 105 will be described in order.

Figure 5:
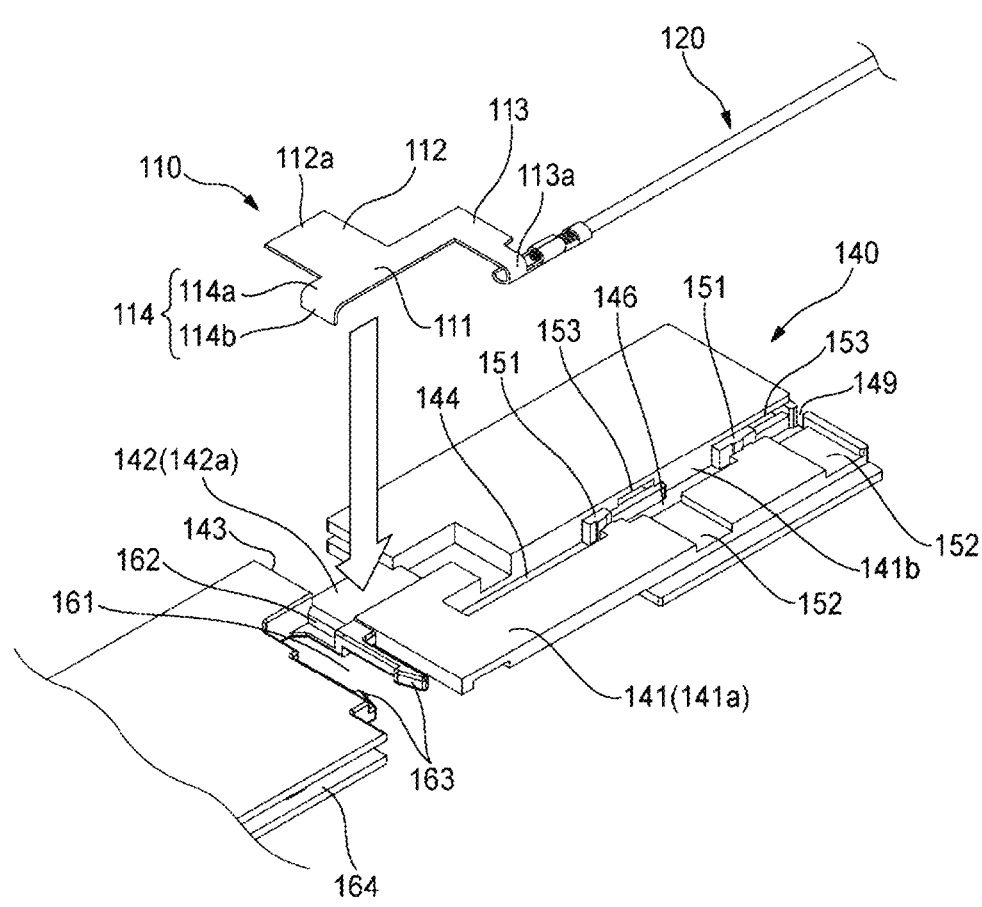
FIG. 5 is a perspective view illustrating an operation when the voltage detection terminal is accommodated in a housing.
Figure 5:
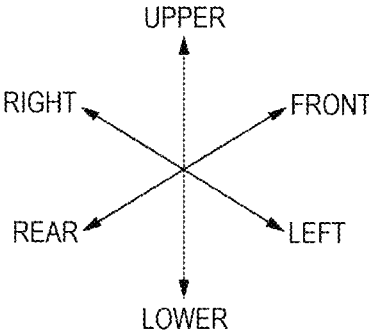

First, the voltage detection terminal 110 will be described. The voltage detection terminal 110 made of metal is formed by processing one metal board via pressing or the like. The voltage detection terminal 110 is accommodated in the terminal accommodating recess 142 of the housing 140 from above. As illustrated in FIGS. 4 and 5, the voltage detection terminal 110 includes a rectangular flat plate-shaped first portion 111 extending in the front-rear direction, a rectangular flat plate-shaped second portion 112 extending rightward from the rear end of the first portion 111, and a rectangular flat plate-shaped third portion 113 extending leftward from the front end of the first portion 111, and has a substantially crank-shaped flat plate shape as a whole when viewed in the upper-lower direction.

One end of the electric wire 120 is fixed and electrically connected to a tip portion 113a of the third portion 113 (that is, the end closer to the left end). The other end of the electric wire 120 is to be connected to a voltage measuring device (not illustrated) outside the power storage device 101. A part of the flange 104a of the conductive board 104 is to be fixed to the lower face of a tip portion 112a of the second portion 112 (that is, the end closer to the right end) by a method such as ultrasonic joining or welding (see FIG. 3).

The voltage detection terminal 110 is provided with an extension portion 114 extending further rearward from the rear end portion of the first portion 111. Specifically, the extension portion 114 includes a first extension portion 114a further extending rearward from the rear end portion of the first portion 111, and a second extension portion 114b extending downward (in the plate thickness direction of the voltage detection terminal 110) from the extension end of the first extension portion 114a. The downward extension length of the second extension portion 114b is larger than the plate thickness of the voltage detection terminal 110. When the voltage detection terminal 110 is accommodated in the housing 140, the extension portion 114 is accommodated in an accommodating recess 162 (see FIGS. 4 and 8) formed in the thermistor mounting recess 161. The effect of providing the extension portion 114 in the voltage detection terminal 110 will be described later.

Next, the cover 130 will be described. The cover 130 is a resin molded article and is mounted to the cover mounting recesses 141 of the housing 140 from the left. As illustrated in FIG. 4, the cover 130 includes a facing portion 131 and an extension portion 132 extending forward from the facing portion 131. The facing portion 131 mainly functions to cover and protect the voltage detection terminal 110, and the extension portion 132 mainly functions to cover and protect the electric wire 120.

The facing portion 131 includes a pair of flat plates 133 and facing each other at an interval in the upper-lower direction, and a coupling portion 134 that couples the left end edges of the pair of flat plates 133 extending in the front-rear direction in the upper-lower direction over the entire region in the front-rear direction. The facing portion 131 has a substantially U-shape opening rightward when viewed in the front-rear direction. The right end edge of each flat plate 133 has a stepped shape inclined in a direction of moving leftward toward the front. The extension portion 132 extends forward from the front end edge of the upper flat plate 133 of the pair of flat plates 133 constituting the facing portion 131 in a flush and continuous manner, and has a substantially rectangular flat plate shape.

The extension portion 132 is integrally formed with two electric wire holding pieces 135 extending in the left-right direction, which are arranged at an interval in the front-rear direction. Each electric wire holding piece 135 protrudes downward from the lower face of the extension portion 132 and extends in the left-right direction, so as to project further rightward from the right end edge of the extension portion 132. When the cover 130 is mounted to the housing 140, the electric wire holding pieces 135 hold the electric wire 120 accommodated in the housing 140.

Figure 9:
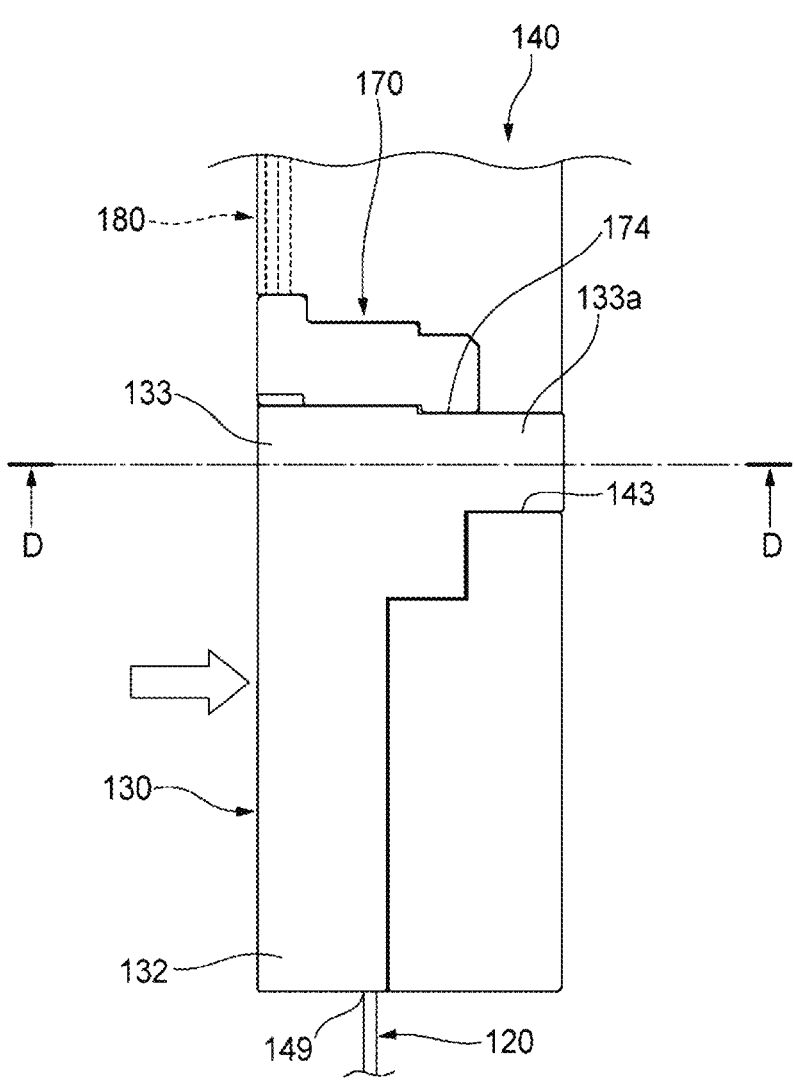
FIG. 9 is a top view illustrating an operation when the cover is attached to the housing illustrated in FIG. 7.
Figure 9:
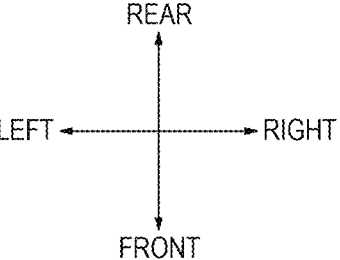
Figure 10:
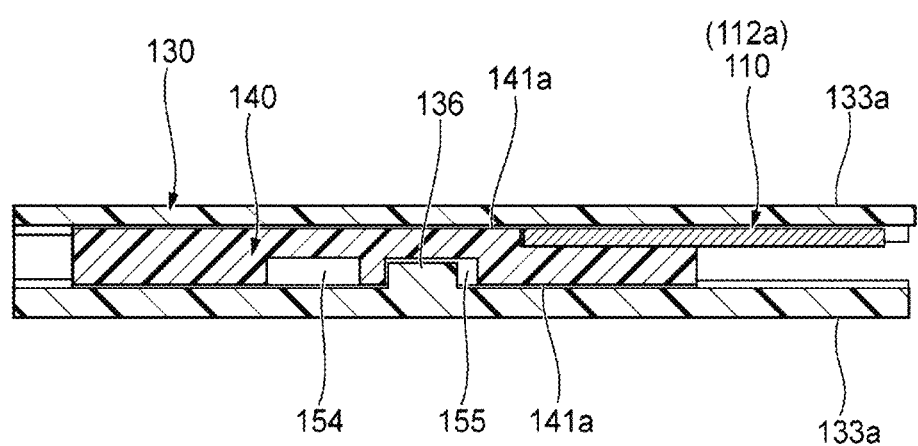
FIG. 10 is a cross-sectional view taken along a line D-D in FIG. 9.
Figure 10:
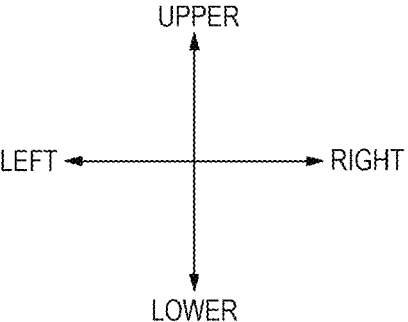

The lower flat plate 133 of the pair of flat plates 133 constituting the facing portion 131 is formed with a locking portion 136 projecting upward toward the upper flat plate 133 at a predetermined location (see FIG. 10). The locking portion 136 functions to lock the cover 130 to a temporary locking position (not illustrated) and the final locking position (see FIGS. 9 and 10) in cooperation with a temporary locked portion 154 and a final locked portion 155 (provided in the housing 140, which is to be described later. The rear side wall of the cover 130 (that is, the side wall coupling the rear end edges of the pair of flat plates 133 extending in the left-right direction to each other in the upper-lower direction across the left-right direction) is provided with a projection 137 projecting rearward.

Next, the housing 140 will be described. The housing 140 is a resin molded article and has a substantially rectangular thin board shape extending in the front-rear direction as illustrated in FIG. 1, etc. The right end face of the housing 140 is formed with a recess 105a recessed leftward and extending in the front-rear direction. The flange 104a of the conductive board 104 is to be fitted into the recess 105a (see FIG. 2).

Figure 6:
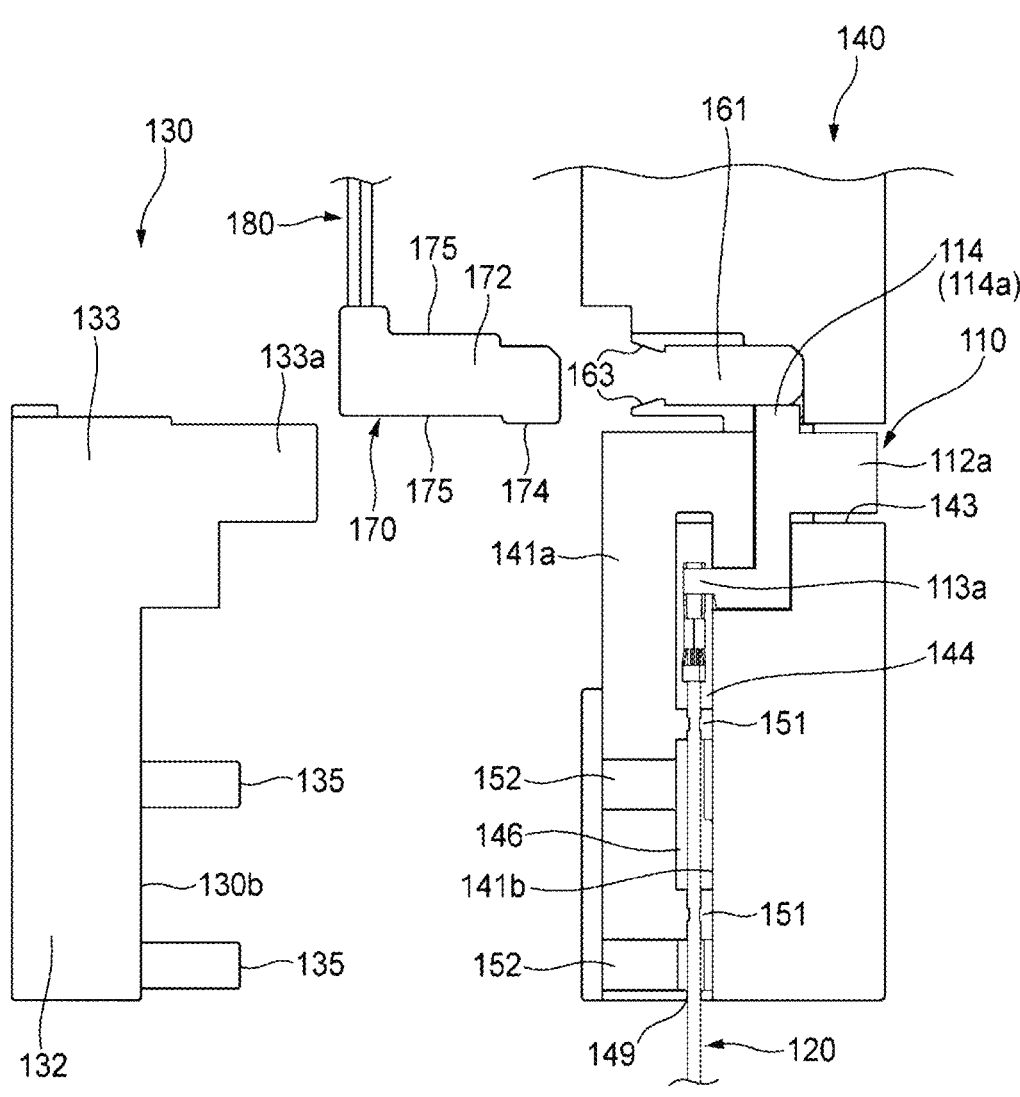
FIG. 6 is a top view illustrating a thermistor, a cover, and the housing accommodating the voltage detection terminal and an electric wire.
Figure 6:
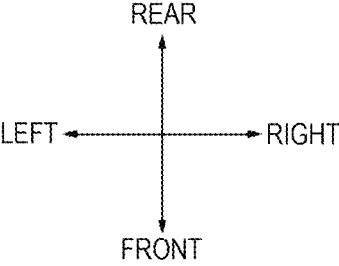

The locations on the upper and lower faces of the housing 140 where the cover 130 is mounted are each formed with the cover mounting recess 141 recessed into a shape corresponding to the entire shape of the cover 130 (see FIGS. 4 to 6). The recess depth (depth in the upper-lower direction) of the cover mounting recesses 141 is equal to the plate thickness of the resin material constituting the cover 130 (the facing portion 131+the extension portion 132). Thus, when the cover 130 is mounted to the housing 140, the face of the housing 140 is flush with the face of the cover 130 (see FIGS. 1 and 9).

The location where the voltage detection terminal 110 is accommodated on a bottom face 141a of the upper cover mounting recess 141 of the housing 140 is formed with the terminal accommodating recess 142 further recessed into a shape corresponding to the entire shape of the voltage detection terminal 110 (see FIGS. 4 and 5). The recess depth (depth in the upper-lower direction) of the terminal accommodating recess 142 is equal to the plate thickness of the voltage detection terminal 110. Thus, when the voltage detection terminal 110 is mounted to the housing 140, the upper face of the voltage detection terminal 110 is flush with the bottom face 141a of the cover mounting recess 141.

The position in the front-rear direction in the right end edge of the housing 140 where the tip portion 112a of the voltage detection terminal 110 is disposed is formed with a notch 143 recessed leftward into a substantially rectangular shape when viewed in the upper-lower direction. The recess 105a extending in the front-rear direction in the right end face of the housing 140 is divided by the notch 143. When the voltage detection terminal 110 is accommodated in the housing 140, the upper and lower faces of the tip portion 112a of the voltage detection terminal 110 are to be exposed by the notch 143.

The location in the terminal accommodating recess 142 where the tip portion 113a of the voltage detection terminal 110 is disposed is formed with a through hole 144 extending in the front-rear direction and penetrating in the upper-lower direction (see FIGS. 4 and 5). When the voltage detection terminal 110 is accommodated in the housing 140, the one end (contact point) of the electric wire 120 connected to the voltage detection terminal 110 enters the through hole 144 (see FIGS. 6 and 7). In other words, the through hole 144 functions as a clearance for avoiding interference between the bottom face 142a of the terminal accommodating recess 142 and the one end of the electric wire 120.

The location on the bottom face 141a of the upper cover mounting recess 141 of the housing 140 where the electric wire 120 is accommodated is formed with an electric wire accommodating recess 146 having a shape corresponding to the wiring form of the electric wire 120 when the electric wire 120 is accommodated (see FIGS. 4 and 5). In the present embodiment, the electric wire accommodating recess 146 is a groove extending in a straight line in the front-rear direction. The rear end of the electric wire accommodating recess 146 communicates with the terminal accommodating recess 142, and the front end of the electric wire accommodating recess 146 constitutes an electric wire outlet 149 through which the electric wire 120 extends from the front end edge of the housing 140.

Two locations at an interval in the front-rear direction in the electric wire accommodating recess 146 are each provided with a narrow recess 151, which is a recess having a width (interval in the left-right direction) narrower than the other parts of the electric wire accommodating recess 146. The width of the narrow recess 151 is slightly smaller than the outer diameter of the electric wire 120. Thus, the electric wire 120 is pinched while being pressed in the left-right direction. By pinching the electric wire 120 between the pair of narrow recesses 151, even if an unintended external force is applied to the electric wire 120 drawn out from the housing 140, it is possible to resist the external force by friction between the narrow recesses 151 and the electric wire 120. Thus, a large external force is hardly applied to the contact point between the voltage detection terminal 110 and the electric wire 120.

As illustrated in FIGS. 4 and 5, the locations on the bottom face 141a of the upper cover mounting recess 141 of the housing 140 at which the pair of electric wire holding pieces 135 of the cover 130 are arranged are formed with a pair of electric wire holding piece recesses 152 extending in the left-right direction at an interval in the front-rear direction, so as to correspond to the pair of electric wire holding pieces 135.

The electric wire holding piece recesses 152 extend in the left-right direction from the left end edge of the upper face of the housing 140 to the right inner wall 141b (see FIGS. 4 and 5) defining the right end of the upper cover mounting recess 141 across the electric wire accommodating recess 146. Each of the locations on the right inner wall 141b of the upper cover mounting recess 141 where the pair of electric wire holding piece recesses 152 are connected is formed with a storage hole 153 recessed rightward (see FIGS. 4 and 5). When the cover 130 is mounted to the housing 140, the extension ends (that is, the right end) of the pair of electric wire holding pieces 135 of the cover 130 are to be inserted and stored in the pair of storage holes 153.

As illustrated in FIG. 10, the bottom face 141a of the lower cover mounting recess 141 of the housing 140 is formed with a temporary locked portion 154 and a final locked portion 155 which are recesses recessed upward. The temporary locked portions 154 and the final locked portions 155 are provided at locations where the locking portion 136 of the cover 130 is located at the temporary locking position (not illustrated) and the final locking position (see FIGS. 9 and 10), respectively. Specifically, the temporary locked portion 154 and the final locked portion 155 are aligned in the left-right direction such that the final locked portion 155 is positioned to the right of the temporary locked portion 154.

At the left end edge of the housing 140 extending in the front-rear direction, the location where the thermistor 170 is mounted, that is, the location adjacent to the rear side of the upper-lower cover mounting recess 141, is formed with a thermistor mounting recess 161 having a shape corresponding to the overall shape of (a body 172 to be described later of) the thermistor 170 and recessed rightward in a substantially rectangular shape when viewed in the upper-lower direction (see FIGS. 4 to 6).

The thermistor 170 is a component that functions to measure the temperature of the voltage detection terminal 110, and is mounted to the thermistor mounting recess 161 of the housing 140 from the left. Specifically, as illustrated in FIG. 8, the thermistor 170 includes a thermistor element 171 constituting a temperature-measuring element and a resin body 172 accommodating the thermistor element 171 therein. The body 172 has a substantially rectangular parallelepiped shape extending in the left-right direction, and has an internal space 172a for accommodating the thermistor element 171 (see FIG. 8). The gap between the thermistor element 171 accommodated in the internal space 172a and the inner wall face defining the internal space 172a is filled with a sealing material 173 (see FIG. 8). The thickness (the length in the upper-lower direction) of the body 172 is equal to the depth (the length in the upper-lower direction) of the thermistor mounting recess 161 (=the plate thickness of the resin material constituting the housing 140). Thus, when the thermistor 170 is mounted to the housing 140, the face of the housing 140 is flush with the face of the body 172 (see FIGS. 7 to 9).

Inside the body 172, the thermistor element 171 is fixed and electrically connected to one end of an electric wire 180. The electric wire 180 connected to the thermistor element 171 extends rearward from the left end of the body 172 toward the outside of the body 172 (see FIGS. 4 and 6). The other end of the electric wire 180 is to be connected to a temperature measuring device (not illustrated) outside the power storage device 101.

The upper right end of the substantially rectangular parallelepiped body 172 extending in the left-right direction is integrally provided with a protruding board 174 protruding forward and extending in the left-right direction (see FIGS. 4 and 6 to 9). When the thermistor 170 is mounted to the housing 140, the protruding board 174 engages with the extension portion 114 (more specifically, the first extension portion 114a) of the voltage detection terminal 110 accommodated in the terminal accommodating recess 142 (see FIG. 8). Both the front and rear outer faces of the body 172 are provided with locking portions 175 (see FIGS. 4 and 6). When the thermistor 170 is mounted to the housing 140, the locking portions 175 are locked to locked portions 163 provided in the thermistor mounting recess 161, which will be described later. In this example, the locking portions 175 are configured with cavities provided in grooves extending in the left-right direction provided in the front and rear side walls of the body 172. The front side wall of the body 172 is provided with a notch-shaped cavity 176 extending in the left-right direction. When the cover 130 and the thermistor 170 are mounted to the housing 140, the projection 137 of the cover 130 is fitted into the cavity 176.

The upper portion of the front inner wall on the bottom (right end) of the thermistor mounting recess 161 communicates with the rear end of the terminal accommodating recess 142. The upper portion of the front inner wall is formed with an accommodating recess 162. The accommodating recess 162 is a groove adjacent to the rear side of the rear end edge of the bottom face 142a of the terminal accommodating recess 142 and recessed downward from the bottom face 142a. Both the front and rear inner faces of the thermistor mounting recess 161 are provided with the locked portions 163. In this example, the locked portions 163 each include a cantilevered locking piece extending in the left-right direction in a manner adjacent to and along the front inner face of the thermistor mounting recess 161, and a locking strip extending in the left-right direction provided on the rear inner face of the thermistor mounting recess 161. The entire region in the front-rear direction behind the thermistor mounting recess 161 in the left end face of the substantially rectangular thin board-shaped housing 140 extending in the front-rear direction is formed with a recess 164 recessed in the right direction and extending in the front-rear direction (see FIGS. 4 and 5). The recess 164 is to accommodate the electric wire electric wire 180 extending from the thermistor 170 (see FIGS. 7 and 9). The members constituting the voltage detection unit 105 have been described above.

Next, a procedure for assembling the voltage detection terminal 110, the thermistor 170 and the cover 130 to the housing 140 will be described. First, the voltage detection terminal 110, which is connected to the electric wire 120 in advance, is accommodated in the terminal accommodating recess 142 of the housing 140. Thus, the voltage detection terminal 110 is fitted into the terminal accommodating recess 142 of the housing 140 from above such that the one end (contact point) of the electric wire 120 enters the through hole 144 (see the white arrow in FIG. 5). Here, the voltage detection terminal 110 has a shape that does not interfere with (the terminal accommodating recess 142 of) the housing 140 between an accommodation position accommodated in the terminal accommodating recess 142 (the position of the voltage detection terminal 110 illustrated in FIG. 6) and an external position assumed as moved away from the housing 140 in the plate thickness direction (upper-lower direction) from the accommodation position (the position of the voltage detection terminal 110 illustrated in FIG. 5). Thus, when the voltage detection terminal 110 is accommodated in the terminal accommodating recess 142, the voltage detection terminal 110 can be accommodated in the terminal accommodating recess 142 simply by linearly moving the entire voltage detection terminal 110 downward toward the terminal accommodating recess 142 (in the plate thickness direction) while keeping the voltage detection terminal 110 horizontal (in an orientation orthogonal to the upper-lower direction).

Figure 7:
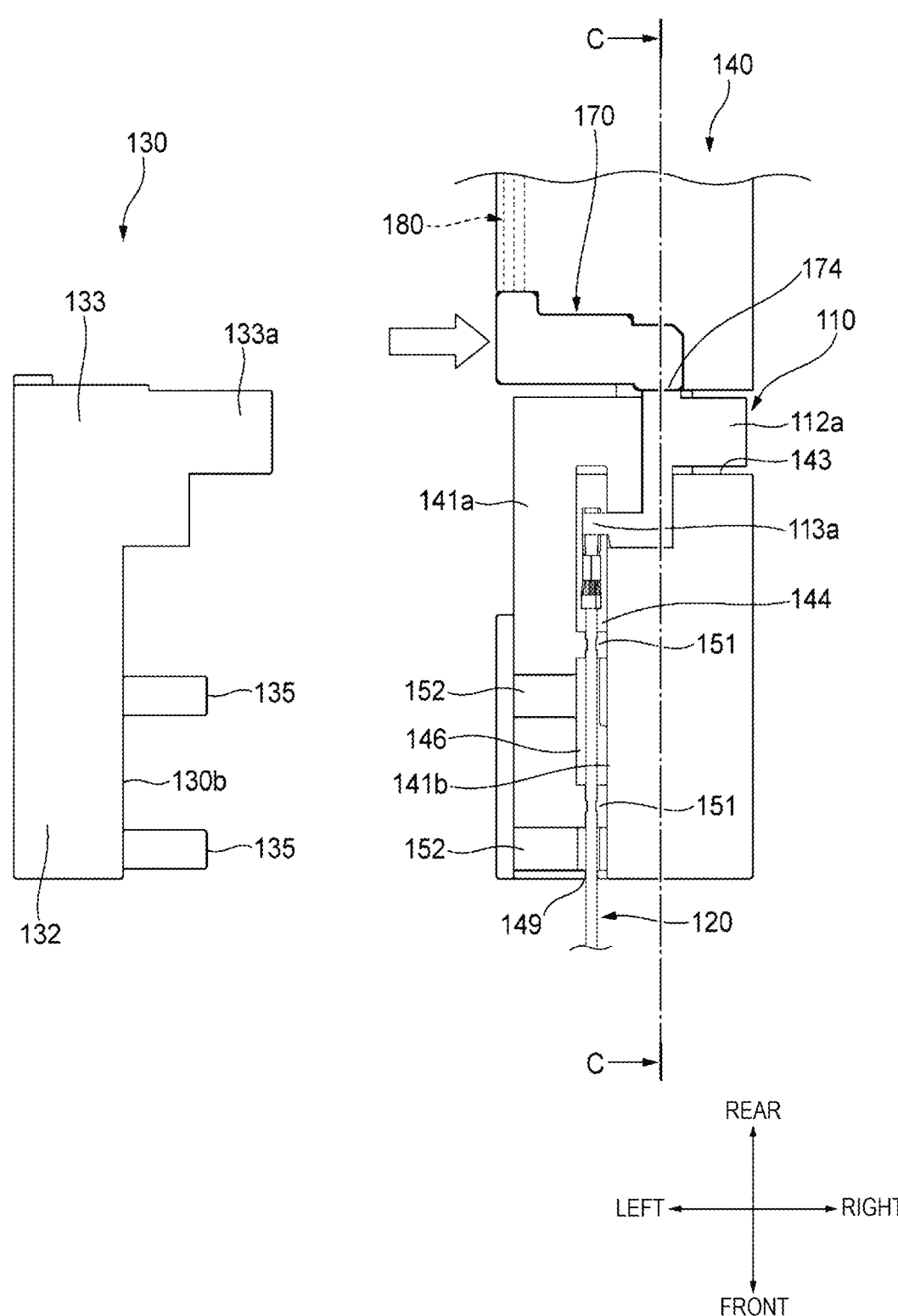
FIG. 7 is a top view illustrating an operation when the thermistor is attached to the housing illustrated in FIG. 6.
Figure 8:
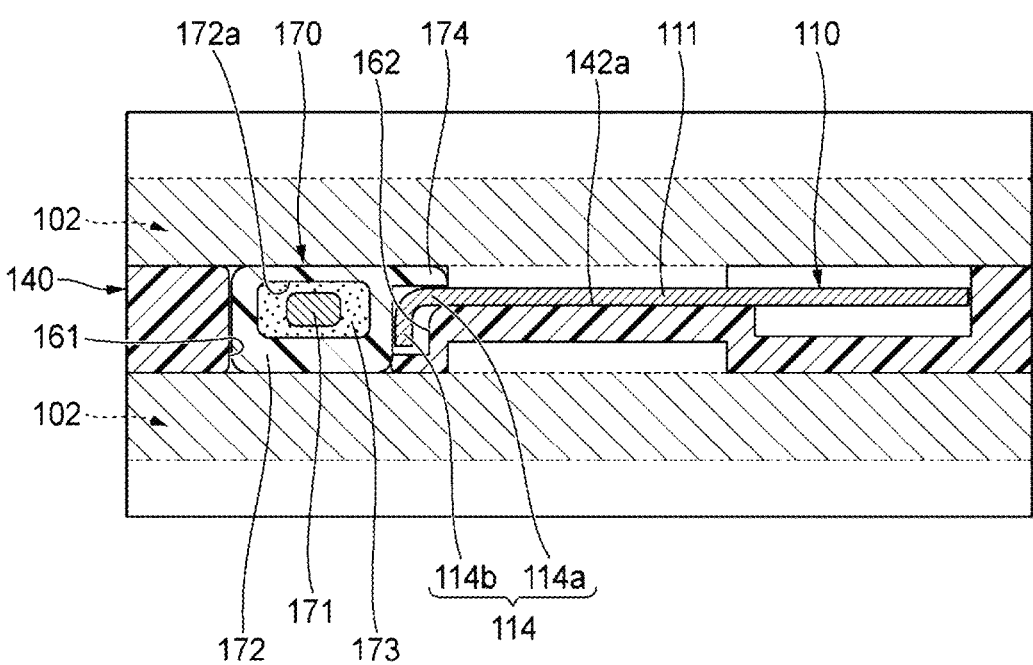
FIG. 8 is a cross-sectional view taken along a line C-C in FIG. 7.
Figure 8:
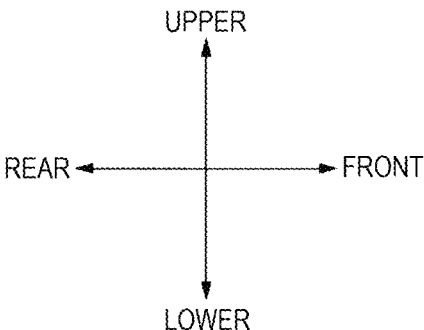

In a state in which the voltage detection terminal 110 is completely accommodated in the housing 140, the upper and lower faces of the tip portion 112a of the voltage detection terminal 110 are exposed by the notch 143 (see FIGS. 6 and 7). Further, the second extension portion 114b of the extension portion 114 is accommodated in the accommodating recess 162 of the thermistor mounting recess 161 so that the first extension portion 114a of the extension portion 114 of the voltage detection terminal 110 closes the upper opening of the accommodating recess 162 (see FIG. 8).

Next, the electric wire 120 extending from the voltage detection terminal 110 accommodated in the housing 140 is accommodated in the electric wire accommodating recess 146 of the housing 140. Therefore, the electric wire 120 is fitted along the electric wire accommodating recess 146 from above. At this time, a pair of portions of the electric wire 120 positioned at the upper portions of the pair of narrow recesses 151 are pushed downward, so that the pair of portions of the electric wire 120 are accommodated in the pair of narrow recesses 151. In a state in which the electric wire 120 is completely accommodated in the housing 140, the electric wire 120 extends forward from the electric wire outlet 149 to the outside of the housing 140.

Next, the thermistor 170 is mounted to the housing 140. Therefore, the body 172 of the thermistor 170 is fitted into the thermistor mounting recess 161 of the housing 140 from the left, so that the locking portions 175 of the body 172 is locked to the locked portions 163 of the thermistor mounting recess 161 (see the white arrow in FIG. 7). The electric wire 180 extending rearward from the left end of the body 172 is accommodated in a recess 164 (see FIGS. 4 and 5) extending in the front-rear direction provided in the left end face of the housing 140, and extends to the outside of the housing 140 through the rear end opening of the recess 164 (see FIG. 1).

In a state where the thermistor 170 is completely mounted in the thermistor mounting recess 161, as illustrated in FIG. 8, the protruding board 174 provided on the body 172 of the thermistor 170 is engaged with the first extension portion 114a to overlap the upper side of the first extension portion 114a of the extension portion 114 of the voltage detection terminal 110. Accordingly, the voltage detection terminal 110 accommodated in the terminal accommodating recess 142 is restricted from moving upward (in the plate thickness direction). Therefore, for example, the voltage detection terminal 110 accommodated in the terminal accommodating recess 142 is avoided from unintentionally moving upward (in the plate thickness direction) and hindering the attachment of the cover 130 to the housing 140. Further, if the voltage detection terminal 110 moves upward (in the plate thickness direction) from the original accommodation position before the thermistor 170 is attached to the housing 140 (for example, if the voltage detection terminal 110 is not appropriately accommodated in the terminal accommodating recess 142 and rides on the peripheral edge of the terminal accommodating recess 142), the protruding board 174 interferes with the first extension portion 114a of the extension portion 114, and the attachment of the thermistor 170 to the housing 140 is hindered by the voltage detection terminal 110, so that it can be detected that the voltage detection terminal 110 is not appropriately accommodated in the terminal accommodating recess 142. In this example, the protruding board 174 of the thermistor 170 is in contact with the first extension portion 114a of the voltage detection terminal 110, but the protruding board 174 and the first extension portion 114a may be separated from each other with a gap that can be allowed from the viewpoint of the above-described restriction.

Further, in a state where the thermistor 170 is completely mounted to the thermistor mounting recess 161, the second extension portion 114b of the extension portion 114 of the voltage detection terminal 110 is adjacent to the right side of the body 172 of the thermistor 170 (see FIG. 8). The second extension portion 114b of the voltage detection terminal 110 and the body 172 of the thermistor 170 may be in contact with each other, or may be separated from each other with a gap that can be allowed from the viewpoint of improving the heat conductivity described later. As a result, the heat of the second extension portion 114b (that is, the voltage detection terminal 110) is conducted to the thermistor element 171 accommodated in the body 172 via the body 172 and the sealing material 173 filled in the internal space 172a of the body 172 in this order. Thereby, the thermistor 170 can measure the temperature of the voltage detection terminal 110. Here, the body 172 of the thermistor 170 is adjacent to the second extension portion 114b extending downward (in the plate thickness direction of the voltage detection terminal 110) included in the voltage detection terminal 110. This increases the size of the range that contributes to the heat conduction from the voltage detection terminal 110 to the body 172 (in other words, the contact area therebetween, or the area of the range where they are adjacent even if not in contact with each other) as compared to a case where only the edge of the voltage detection terminal 110 is adjacent to the body 172 of the thermistor 170. Accordingly, the thermistor 170 can accurately measure the temperature of the voltage detection terminal 110 (and hence the temperature of the power storage module 102 conducted through the conductive board 104 and the voltage detection terminal 110 in the stacked power storage device 101). Conducted to the thermistor 170 is not only the heat conducted from the power storage module 102 via the conductive board 104 and the voltage detection terminal 110 but also the heat conducted from the power storage modules 102 sandwiching the thermistor 170 in the upper-lower direction.

Next, the cover 130 is mounted to the housing 140 by being locked to the housing 140 at the first temporary locking position. For this purpose, the cover 130 is pushed rightward, such that the facing portion 131 of the cover 130 sandwiches the upper and lower cover mounting recesses 141 of the housing 140 in the upper-lower direction, the extension portion 132 of the cover 130 covers the upper cover mounting recesses 141 of the housing 140, and the pair of electric wire holding pieces 135 of the cover 130 cover the pair of electric wire holding piece recesses 152 of the housing 140 (see the white arrows in FIG. 9). In the process in which the cover 130 moves rightward relative to the housing 140, the locking portion 136 of the cover 130 slides on the bottom face 141a of the cover mounting recess 141. Thereafter, the locking portion 136 enters the temporary locked portion 154 (see FIG. 10) and engages with the temporary locked portion 154. Accordingly, the cover 130 is locked to the housing 140 at the temporary locking position, and the cover 130 is completely mounted to the housing 140 to obtain the voltage detection unit 105 (see FIG. 1). In a state in which the cover 130 is locked at the temporary locking position, the upper and lower right end edges 130b of the cover 130 (see FIGS. 4, 6, and 7) are not in contact with the upper and lower right inner walls 141b (see FIGS. 4 to 7) of the housing 140, and there are gaps in the left-right direction between the right end edges 130b and the right inner walls 141b. As described later, the voltage detection unit 105 obtained after the cover 130 is completely mounted to the housing 140 (in a state in which the cover 130 is locked at the temporary locking position) is to be used for assembling the conductive module 103 (see FIG. 1).

In a state in which the cover 130 is locked at the temporary locking position, the facing portion 131 of the cover 130 (more specifically, the right ends 133a of the pair of upper and lower flat plates 133 (see FIGS. 4, 6, and 7)) does not cover the tip portion 112a of the voltage detection terminal 110. Thus, the upper and lower faces of the tip portion 112a of the voltage detection terminal 110 are also exposed by the notch 143.

Further, the pair of electric wire holding pieces 135 of the cover 130 are arranged above the opening of the electric wire accommodating recess 146. This prevents the electric wire 120 from coming out of the electric wire accommodating recess 146. Further, the extension ends of the pair of electric wire holding pieces 135 are received in the pair of storage holes 153. Accordingly, it is possible to prevent unintended deformation such as misalignment of the pair of electric wire holding pieces 135 or separation of the pair of electric wire holding pieces 135 from the electric wire accommodating recess 146.

Hereinafter, a procedure for moving the cover 130 locked at the temporary locking position to the final locking position (see FIGS. 9 and 10) will be described. In order to move the cover 130 locked at the temporary locking position to the final locking position, the cover 130 locked at the temporary locking position is pushed rightward (see the white arrow in FIG. 9). In the process in which the cover 130 moves rightward relative to the housing 140, the extension ends of the pair of electric wire holding pieces 135 of the cover 130 further enter and are stored in the pair of storage holes 153. Simultaneously, the locking portion 136 of the cover 130 goes beyond the temporary locked portion 154 and slides on the bottom face 141a of the cover mounting recess 141. Thereafter, the locking portion 136 enters the inside of the final locked portion 155 and is engaged with the final locked portion 155, and the upper and lower right end edges 130b of the cover 130 come into contact with the upper and lower right inner walls 141b of the housing 140, respectively. Thus, the cover 130 is locked to the housing 140 at the final locking position (see FIGS. 9 and 10).

In a state in which the cover 130 is locked at the final locking position, as illustrated in FIG. 9, the entire cover mounting recess 141 is covered with the cover 130 without a gap, and thus the entire electric wire accommodating recess 146 is covered with the extension portion 132 of the cover 130. This prevents the electric wire 120 from coming out of the electric wire accommodating recess 146. Further, as illustrated in FIG. 10, the facing portion 131 of the cover 130 (more specifically, the right end 133a of the pair of upper and lower flat plates 133) covers the upper and lower faces of the tip portion 112a of the voltage detection terminal 110. Accordingly, the entire voltage detection terminal 110 is covered with the facing portion 131 of the cover 130, so that the voltage detection terminal 110 can be reliably protected.

As described above, the voltage detection unit 105 obtained after the cover 130 is completely mounted to the housing 140 (in a state in which the cover 130 is locked at the temporary locking position) is used for assembling the conductive module 103 (see FIG. 1). Specifically, first, as illustrated in FIG. 2, the flange 104a of the conductive board 104 is fitted into the recess 105a of the voltage detection unit 105, so that the voltage detection unit 105 is coupled to the left side of the conductive board 104.

In this state, as can be understood from FIG. 3, a part of the flange 104a of the conductive board 104 overlaps the lower side of the tip portion 112a of the voltage detection terminal 110, and the upper face of the tip portion 112a of the voltage detection terminal 110 is exposed upward and the lower face of a part of the flange 104a of the conductive board 104 is exposed downward due to the presence of the notch 143 of the housing 140.

Next, the upper face of the tip portion 112a of the voltage detection terminal 110 exposed upward and the lower face of a part of the flange 104a of the conductive board 104 exposed downward are used to fix the tip portion 112a of the voltage detection terminal 110 and the part of the flange 104a of the conductive board 104 by a method such as ultrasonic joining or welding. Thereafter, the cover 130 is moved from the temporary locking position to the final locking position, and the voltage detection unit 105 is completely assembled to the conductive board 104.

Next, the flange 104b of the conductive board 104 is fitted into the recess 106a of the facing unit 106, so that the facing unit 106 is coupled to the right side of the conductive board 104 to which the voltage detection unit 105 is assembled (see FIG. 2, etc.). Thus, the conductive module 103 is completely assembled.

The conductive module 103 thus obtained is used for assembling the power storage device 101 illustrated in FIG. 1. Specifically, the power storage modules 102 and the conductive modules 103 are alternately stacked in the upper-lower direction, and the stacked body is fixed by a predetermined fitting or the like, thereby obtaining the power storage device 101.

Operations and Effects

As described above, according to the voltage detection unit 105 and the power storage device 101 using the voltage detection unit 105 according to the present embodiment, the cover 130 can be locked to the housing 140 while accommodating the voltage detection terminal 110 whose tip portion 113a is connected to the electric wire 120 in the terminal accommodating recess 142 of the housing 140 and exposing the tip portion 112a of the voltage detection terminal 110. Therefore, when the voltage detection unit 105 is electrically connected to the conductive board 104 (the conductive board 104 of the stacked power storage device 101), for example, after the voltage detection unit 105 is assembled to the conductive board 104, the exposed tip portion 112a of the voltage detection terminal 110 can be fixed to the conductive board 104 using a method such as ultrasonic joining or welding. This does not require another component for connection as compared to typical bolt fastening or the like, and can easily align the two components and reduce the contact resistance at the contact point as compared to the connection methods of the related art described above. Further, by disposing the cover 130 at the final locking position after the connection between the conductive board 104 and the voltage detection terminal 110, the tip portion 112a of the voltage detection terminal 110 (that is, the contact point therebetween) can be covered and protected by the cover 130.

Further, to attach the cover 130 to the housing 140, the thermistor 170 is attached to the housing 140, so that the thermistor 170 is engaged with the voltage detection terminal 110, and the voltage detection terminal 110 accommodated in the terminal accommodating recess 142 is restricted from moving in the plate thickness direction (upward). As a result, for example, the voltage detection terminal 110 accommodated in the terminal accommodating recess 142 is avoided from unintentionally moving in the plate thickness direction (upward) and hindering the attachment of the cover 130 to the housing 140. Further, if the voltage detection terminal 110 moves from the original accommodation position in the plate thickness direction (upward) before the thermistor 170 is attached (for example, if the voltage detection terminal 110 is not appropriately accommodated in the terminal accommodating recess 142 and rides on the peripheral edge of the terminal accommodating recess 142), the attachment of the thermistor 170 to the housing 140 is hindered by the voltage detection terminal 110, so that it can be detected that the voltage detection terminal 110 is not appropriately accommodated in the terminal accommodating recess 142. Therefore, the voltage detection unit 105 and the power storage device 101 according to the present embodiment have excellent workability in conductive connection with the conductive board 104. Further, the voltage detection unit 105 and the power storage device 101 according to the present embodiment can easily and appropriately assemble the voltage detection terminal 110 and the cover 130 to the housing 140.

Further, according to the voltage detection unit 105 of the present embodiment, the body 172 of the thermistor 170 is adjacent to the second extension portion 114*b* extending in the plate thickness direction of the voltage detection terminal 110. This increases the size of the range that contributes to the heat conduction from the voltage detection terminal 110 to the body 172 (in other words, the contact area therebetween, or the area of the range where they are adjacent even if not in contact with each other) as compared to a case where only the edge of the voltage detection terminal 110 is adjacent to the body 172. Accordingly, the thermistor 170 can accurately measure the temperature of the voltage detection terminal 110 (in other words, for example, the temperature of the power storage module 102 conducted through the conductive board 104 and the voltage detection terminal 110 in the stack power storage device 101).

Further, according to the voltage detection unit 105 of the present embodiment, the voltage detection terminal 110 has a shape that does not interfere with the housing 140 between the accommodation position accommodated in the terminal accommodating recess 142 and the external position assumed as moved away from the housing 140 in the plate thickness direction (upward) from the accommodation position. Thus, when the voltage detection terminal 110 is accommodated in the terminal accommodating recess 142, the voltage detection terminal 110 can be accommodated in the terminal accommodating recess 142 simply by linearly moving the voltage detection terminal 110 toward the terminal accommodating recess 142 in the plate thickness direction (downward). Accordingly, for example, the voltage detection terminal 110 can be easily accommodated in the terminal accommodating recess 142 as compared to a case that requires an operation of hooking the edge of the voltage detection terminal 110 to the locking hole of the housing 140 when accommodating the voltage detection terminal 110.

Other Embodiments

The present disclosure is not limited to the embodiments described above, and various modifications can be adopted within the scope of the present disclosure. For example, the present disclosure is not limited to the embodiments described above, and modifications, improvements, and the like can be appropriately made. In addition, materials, shapes, sizes, numbers, arrangement positions, and the like of components in the embodiment described above are freely selected and are not limited as long as the present disclosure can be implemented.

Here, the features of the embodiment of the voltage detection unit 105 and the power storage device 101 described above are briefly summarized and listed in the following [1] to [4].

[1] A voltage detection unit (105) including:
  a voltage detection terminal (110) having a first location (112*a*) configured to be conductively connected to a detection target (104);
  a plate-shaped housing (140) having a terminal accommodating recess (142) accommodating the voltage detection terminal (110);
  a cover (130) configured to be locked to the housing (140) at a temporary locking position where the first location (112*a*) of the voltage detection terminal (110) accommodated in the terminal accommodating recess (142) is not covered and a final locking position where the first location (112*a*) is covered;
  a temperature measurer (170) accommodating a temperature-measuring element (171) and attached to the housing (140); and
  an electric wire (120) conductively connected to a second location (113*a*) of the voltage detection terminal (110) and drawn out to the outside of the housing (140), in which
  the temperature measurer (170) is arranged such that at least a part of the temperature measurer (170) is overlapped with the voltage detection terminal (110) in a plate thickness direction of the housing (140) to restrict the voltage detection terminal (110) accommodated in the terminal accommodating recess (142) from moving in the plate thickness direction.

According to the voltage detection unit having the configuration of the above [1], the cover can be locked to the housing while accommodating the voltage detection terminal whose second location is connected to the electric wire in the terminal accommodating recess of the housing and exposing the first location of the voltage detection terminal. Therefore, when the voltage detection unit is electrically connected to a detection target (for example, a conductive board or the like used in a stacked power storage device), for example, after the voltage detection unit is assembled to the detection target, the exposed first location of the voltage detection terminal can be fixed to the detection target using a method such as ultrasonic joining or welding. This does not require another component for connection as compared to typical bolt fastening or the like, and can easily align the two components and reduce the contact resistance at the contact point as compared to the connection methods of the related art described above. Further, by disposing the cover at the final locking position after the detection target and the voltage detection terminal are connected, the first location of the voltage detection terminal (that is, the contact point therebetween) can be covered and protected by the cover.

Further, by attaching a temperature measurer (for example, a thermistor) to the housing before attaching the cover to the housing, at least a part of the temperature measurer is overlapped with the voltage detection terminal in the plate thickness direction, which prevents the voltage detection terminal accommodated in the terminal accommodating recess from moving in the plate thickness direction (so-called ride-on of the voltage detection terminal). The at least a part of the temperature measurer may be in contact with the voltage detection terminal, or may be separated from the voltage detection terminal with a gap that can be allowed from the viewpoint of restricting the movement of the voltage detection terminal. As a result, for example, the voltage detection terminal accommodated in the terminal accommodating recess is avoided from unintentionally moving in the plate thickness direction and hindering the attachment of the cover to the housing. Further, if the voltage detection terminal moves in the plate thickness direction from the original accommodation position before the temperature measurer is attached (for example, if the voltage detection terminal is not appropriately accommodated in the terminal accommodating recess and rides on the peripheral edge of the terminal accommodating recess), the attachment of the temperature measurer to the housing is hindered by the voltage detection terminal, so that it can be detected that the voltage detection terminal is not appropriately accommodated in the terminal accommodating recess.

Accordingly, the voltage detection unit of the present configuration is excellent in workability for conductively connecting to the detection target. Further, the voltage detection unit of the present configuration can easily and appropriately assemble the voltage detection terminal and the cover to the housing.

[2] The voltage detection unit (105) according to the above [1], in which the voltage detection terminal (110) has a third location (114b) extending in the plate thickness direction, and the temperature measurer (170) is arranged adjacent to the third location (114b).

According to the voltage detection unit of the above [2], the temperature measurer is adjacent to the third location extending in the plate thickness direction of the voltage detection terminal. This increases the size of the range that contributes to the heat conduction from the voltage detection terminal to the temperature measurer (in other words, the contact area therebetween, or the area of the range where they are adjacent even if not in contact with each other) as compared to a case where only the edge of the voltage detection terminal is adjacent to the temperature measurer. Accordingly, the temperature measurer can accurately measure the temperature of the voltage detection terminal (in other words, for example, the temperature of the power storage module conducted through a conductive board or the like as the detection target and the voltage detection terminal in a stacked power storage device).

[3] The voltage detection unit (105) according to the above [1], in which the voltage detection terminal (110) has a shape that does not interfere with the housing (140) between an accommodation position where the voltage detection terminal (110) is accommodated in the terminal accommodating recess (142) and an external position where the voltage detection terminal (110) is assumed as moved away from the housing (140) in the plate thickness direction from the accommodation position.

According to the voltage detection unit configured as described in the above [3], the voltage detection terminal has a shape that does not interfere with the housing between the accommodation position accommodated in the terminal accommodating recess and the external position assumed as moved away from the housing in the plate thickness direction from the accommodation position. Thus, when the voltage detection terminal is attached, the voltage detection terminal can be accommodated in the terminal accommodating recess simply by linearly moving the voltage detection terminal in the plate thickness direction from the outside of the housing (that is, from the external position) toward the accommodation position of the terminal accommodating recess. Accordingly, for example, the voltage detection terminal can be easily accommodated in the terminal accommodating recess as compared to a case that requires an operation of hooking the edge of the voltage detection terminal to the locking hole of the housing when accommodating the voltage detection terminal.

[4] A power storage device (101) including:

a board-shaped conductive module (103) including the voltage detection unit (105) according to any one of the above [1] to [3] and a conductive board (104) as the detection target to which the voltage detection terminal (110) is conductively connected; and a power storage module (102) configured to be charged and discharged, on which the conductive module (103) is stacked.

According to the power storage device having the configuration of the above [4], the cover can be locked to the housing while accommodating the voltage detection terminal whose second location is connected to the electric wire in the terminal accommodating recess of the housing and exposing the first location of the voltage detection terminal. Therefore, when the voltage detection unit is electrically connected to a detection target (for example, a conductive board or the like used in a stacked power storage device), for example, after the voltage detection unit is assembled to the detection target, the exposed first location of the voltage detection terminal can be fixed to the detection target using a method such as ultrasonic joining or welding. This does not require another component for connection as compared to typical bolt fastening or the like, and can easily align the two components and reduce the contact resistance at the contact point as compared to the connection methods of the related art described above. Further, by disposing the cover at the final locking position after the detection target and the voltage detection terminal are connected, the first location of the voltage detection terminal (that is, the contact point therebetween) can be covered and protected by the cover.

Further, to attach the cover to the housing, the temperature measurer is attached to the housing, so that at least a part of the temperature measurer is overlapped with the voltage detection terminal in the plate thickness direction, and the voltage detection terminal accommodated in the terminal accommodating recess is restricted from moving in the plate thickness direction. The at least a part of the temperature measurer may be in contact with the voltage detection terminal, or may be separated from the voltage detection terminal with a gap that can be allowed from the point of the above-described restriction. As a result, for example, the voltage detection terminal accommodated in the terminal accommodating recess is avoided from unintentionally moving in the plate thickness direction and hindering the attachment of the cover to the housing. Further, if the voltage detection terminal moves in the plate thickness direction from the original accommodation position before the temperature measurer is attached (for example, if the voltage detection terminal is not appropriately accommodated in the terminal accommodating recess and rides on the peripheral edge of the terminal accommodating recess), the attachment of the temperature measurer to the housing is hindered by the voltage detection terminal, so that it can be detected that the voltage detection terminal is not appropriately accommodated in the terminal accommodating recess.

Accordingly, the power storage device of the present configuration is excellent in workability for conductively connecting to the detection target. Further, the power storage device of the present configuration can easily and appropriately assemble the voltage detection terminal and the cover to the housing.

The invention claimed is:

1. A voltage detection unit comprising:

a voltage detection terminal having a first location configured to be conductively connected to a detection target;

a plate-shaped housing having a terminal accommodating recess accommodating the voltage detection terminal;

a cover configured to be locked to the housing at a temporary locking position where the first location of the voltage detection terminal accommodated in the terminal accommodating recess is not covered and a final locking position where the first location is covered;

a temperature measurer accommodating a temperature-measuring element and attached to the housing; and an electric wire conductively connected to a second location of the voltage detection terminal and drawn out to the outside of the housing, wherein the temperature measurer is arranged such that at least a part of the temperature measurer is overlapped with the voltage detection terminal in a plate thickness direction of the housing to restrict the voltage detection terminal accommodated in the terminal accommodating recess from moving in the plate thickness direction.

2. The voltage detection unit according to claim 1, wherein:

the voltage detection terminal has a third location extending in the plate thickness direction; and the temperature measurer is arranged adjacent to the third location.

3. The voltage detection unit according to claim 1, wherein the voltage detection terminal has a shape that does not interfere with the housing between an accommodation position where the voltage detection terminal is accommodated in the terminal accommodating recess and an external position where the voltage detection terminal is assumed as moved away from the housing in the plate thickness direction from the accommodation position.

4. A power storage device comprising:

a board-shaped conductive module including the voltage detection unit according to claim 1 and a conductive board as the detection target to which the voltage detection terminal is conductively connected; and a power storage module configured to be charged and discharged, on which the conductive module is stacked.

5. The voltage detection unit according to claim 1, wherein the temperature measurer is mounted in a mounting recess formed in the housing.

* * * * *